US011282673B2

(12) United States Patent
Meng et al.

(10) Patent No.: US 11,282,673 B2
(45) Date of Patent: *Mar. 22, 2022

(54) ION IMPLANTATION SYSTEM AND SOURCE BUSHING THEREOF

(71) Applicant: Taiwan Semiconductor Manufacturing Co., Ltd., Hsinchu (TW)

(72) Inventors: Ying-Chieh Meng, Taichung (TW); Chui-Ya Peng, Hsinchu (TW); Nai-Han Cheng, Zhudong Township (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/996,696

(22) Filed: Aug. 18, 2020

(65) Prior Publication Data

US 2020/0381210 A1    Dec. 3, 2020

Related U.S. Application Data

(63) Continuation of application No. 16/408,795, filed on May 10, 2019, now Pat. No. 10,784,079.

(Continued)

(51) Int. Cl.
 *H01J 37/317*  (2006.01)
 *H01J 37/08*  (2006.01)
 (Continued)

(52) U.S. Cl.
 CPC .......... *H01J 37/3171* (2013.01); *C23C 14/48* (2013.01); *H01J 27/205* (2013.01);
 (Continued)

(58) Field of Classification Search
 CPC ...... H01J 37/3171; H01J 27/205; H01J 37/08; H01J 2237/083; H01L 21/26513; H01L 21/823814; C23C 14/48
 See application file for complete search history.

(56) References Cited

U.S. PATENT DOCUMENTS

| 5,330,800 A | 7/1994 | Schumacher et al. |
| 10,784,079 B2 * | 9/2020 | Meng ............... H01L 21/26513 |
| 2008/0305598 A1 | 12/2008 | Horsky et al. |

FOREIGN PATENT DOCUMENTS

| TW | I404128 B | 8/2013 |
| TW | I567775 B | 1/2017 |

(Continued)

OTHER PUBLICATIONS

Office Action, dated May 20, 2020, for Taiwanese Intellectual Property Office Appl. No. 108133283, 4 pages.

*Primary Examiner* — Nicole M Ippolito
*Assistant Examiner* — Hanway Chang
(74) *Attorney, Agent, or Firm* — Sterne, Kessler, Goldstein & Fox P.L.L.C.

(57) ABSTRACT

The present disclosure describes an ion implantation system that includes a bushing designed to reduce the accumulation of IMP by-produces on the bushing's inner surfaces. The ion implantation system can include a chamber, an ion source configured to generate an ion beam, and a bushing coupling the ion source and the chamber. The bushing can include (i) a tubular body having an inner surface, a first end, and a second end and (ii) multiple angled trenches disposed within the inner surface of the tubular body, where each of the multiple angled trenches extends towards the second end of the tubular body.

20 Claims, 6 Drawing Sheets

Related U.S. Application Data

(60) Provisional application No. 62/736,946, filed on Sep. 26, 2018.

(51) Int. Cl.
    *H01J 27/20*     (2006.01)
    *H01L 21/8238*     (2006.01)
    *C23C 14/48*     (2006.01)
    *H01L 21/265*     (2006.01)

(52) U.S. Cl.
    CPC ........ *H01J 37/08* (2013.01); *H01L 21/26513* (2013.01); *H01L 21/823814* (2013.01); *H01J 2237/083* (2013.01)

(56) References Cited

FOREIGN PATENT DOCUMENTS

| | | |
|---|---|---|
| WO | WO-2000/57451 A2 | 9/2000 |
| WO | WO-2009/102762 A2 | 8/2009 |
| WO | WO-2010/093380 A1 | 8/2010 |

\* cited by examiner

ION IMPLANTATION SYSTEM AND SOURCE BUSHING THEREOF

RELATED APPLICATIONS

This application is a continuation of U.S. patent application Ser. No. 16/408,795, titled "Ion Implantation System and Source Bushing Thereof," filed on May 10, 2019, which claims the benefit of U.S. Provisional Patent Application No. 62/736,946, filed Sep. 26, 2018, titled "Ion Implantation System and Source Bushing Thereof," which are both incorporated by reference herein in their entireties.

BACKGROUND

An ion implantation system requires a high voltage to generate ion beams to irradiate a wafer. A source bushing is an insulating component to prevent arcing within the ion implantation system when operating the ion implantation system with the high voltage. The aging and deterioration of the source bushing can cause a damage and a significant maintenance cost to the ion implantation system.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

Ion implantation system (also referred to herein as "IMP") is a semiconductor fabrication apparatus used to implant one or more dopant elements into a semiconductor wafer to form doped regions at desired depths in the semiconductor wafer. The dopant elements are introduced into the semiconductor wafer with an ion beam generated and controlled by the IMP. To produce the ion beam, a gas or feed material contained the desired dopant material is introduced into an ion source, where a high energy is applied to ionize the gas or feed material to form the ion beam. An accelerating electric field is provided by IMP electrodes to extract and direct the ion beam moving toward the semiconductor wafer.

To generate the high energy to ionize the gas or feed material, the IMP introduces a high voltage, in the order of 10-100 kV. Such high voltage can create an unwanted arcing inside the IMP which can damage or degrade IMP performance. To prevent the unwanted arcing, a tubular insulating source bushing (also referred to herein as "bushing") is disposed within the IMP to provide an electrical isolation or insulation between various IMP conductor components.

When forming ion beams at the ion source, impurities (also referred to herein as "IMP by-products") from the residue gas and part of the ionized elements are also formed. These IMP by-products can adhere to inner surfaces of the bushing. The accumulation or coating of such IMP by-products to the bushing's inner surfaces can gradually create an unwanted conduction path along the bushing and compromise the bushing's insulation capability, thus increasing the risk of unwanted arcing. Hence, it is necessary to routinely to clean or replace the bushing to ensure proper IMP operation. However, such cleaning can be time- and cost-consuming.

The present disclosure is directed to a bushing structure designed to avoid or reduce the accumulation of the IMP by-products on the bushing's inner surfaces. In some embodiments, the bushing includes a tubular body with tilted trenches disposed within the tubular body's inner surfaces. In some embodiments, the tilted trenches can be configured to extend towards an end of the tubular body. As a result, a bottom and a sidewall of the tilted trenches are disposed inside the tubular body, which can inhibit forming the unwanted conduction path inside the bushing and improve electrical insulation reliability.

The present disclosure also provides example systems and methods to monitor a status of an IMP's bushing. In some embodiments, the IMP includes an image sensor to monitor the bushing's inner surfaces. In some embodiments, the IMP can further include an electrical measurement device to record electrical current within the ion source to detect an electrical insulation property of the bushing, according to some embodiments. Data recorded by the image sensor or the electrical measurement device can be received by a computer system, where the computer system can be configured to dynamically adjust an operation procedure or an scheduling of preventive maintenance of the IMP. As a result, IMP manufacturing cost and overhead can be reduced.

Figure 1A:
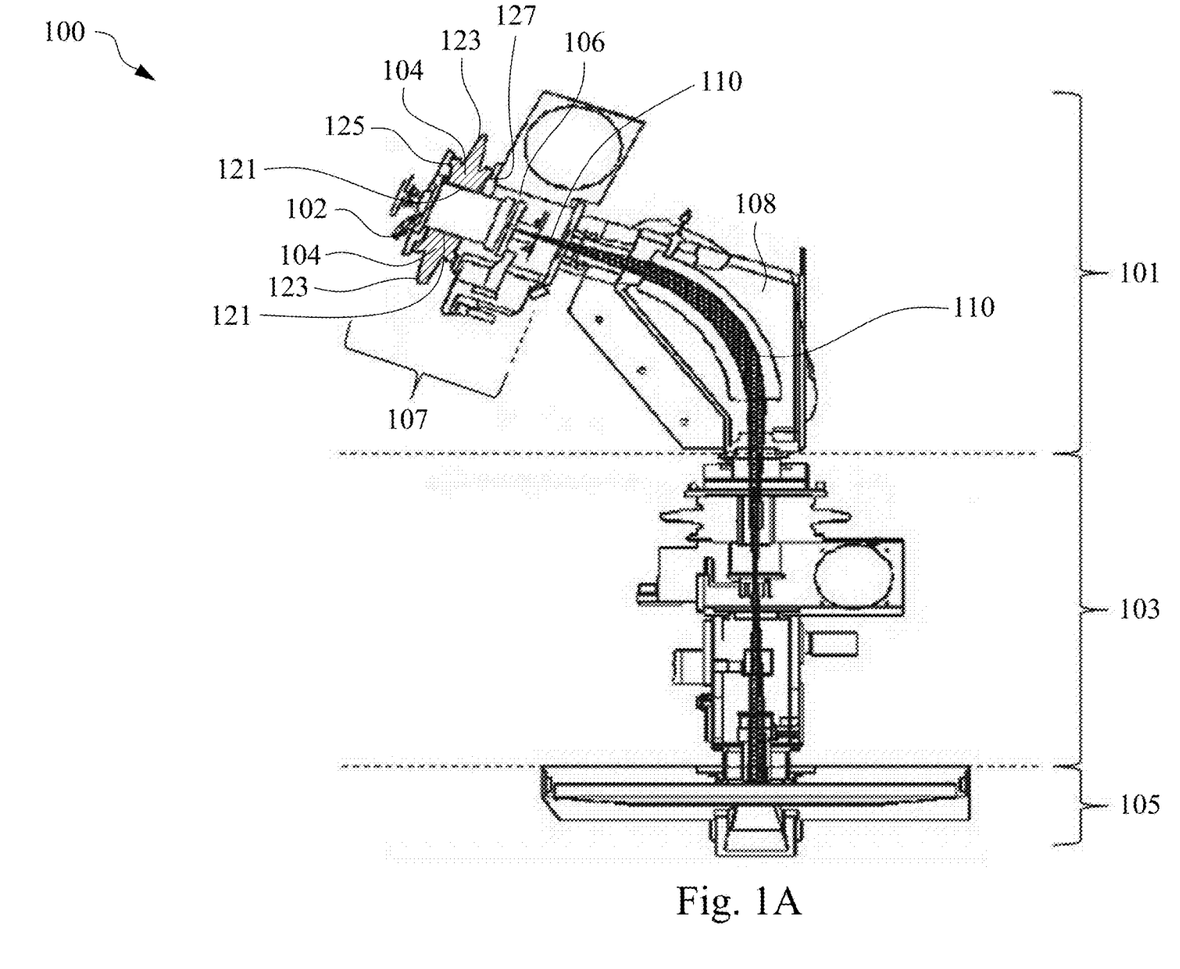
FIG. 1A is an isometric view of an ion implantation system, according to some embodiments.

FIG. 1A is an isometric view of an IMP 100, according to some embodiments. IMP 100 can be configured to provide a desired doping type with a desired depth profile on a targeted semiconductor wafer. IMP 100 can include a source area 101, a beamline area 103, and a process chamber 105, where source area 101 can include a source head device 107 and an atomic mass unit 108, where source head device 107 can be configured to generate and extract ion beam 110 moving towards atomic mass unit 108 or beamline area 103.

Source head device 107 can include an ion source 102 and a bushing 104. Source head device 107 can further include conductor components coupling to ion source 102, where the conductor components can include metallic parts in source head device 107, such as a chamber 106. Ion source 102 can be configured to generate an ion species by ionizing an introduced gas or feed material. Ion source 102 can be further configured to extract the ion species to generate ion beam 110 moving towards atomic mass unit 108. Depending on the desired doping type on the targeted semiconductor wafer, different chemicals such as boron trifluoride ($BF_3$), germanium tetrafluoride ($GeF_4$), or silicon tetrafluoride ($SiF_4$), can be selected as the introduced gas or feed material. To generate the ion species, ion source 102 needs to be biased at a high voltage (e.g., on the order of 10-100 kV) to ionize the introduced gas or feed material. This can cause a significant large electrical potential difference (on the order of tens of kV) between ion source 102 and the conductor components. Such large electrical potential difference may easily trigger an unwanted arcing, jeopardizing the operation of IMP 100. As a result, bushing 104, an insulator, is an essential component to electrically insulate ion source 102 from the conductor components within source head device 107.

In some embodiments, IMP 100 can further include an electrical measurement device (not shown in FIG. 1A) to monitor a voltage, a resistance, and/or an electrical current associated with source head device 107. In some embodiments, the electrical measurement device can include an electrical current meter, a voltmeter, and/or an electrical resistance meter.

Figure 1B:
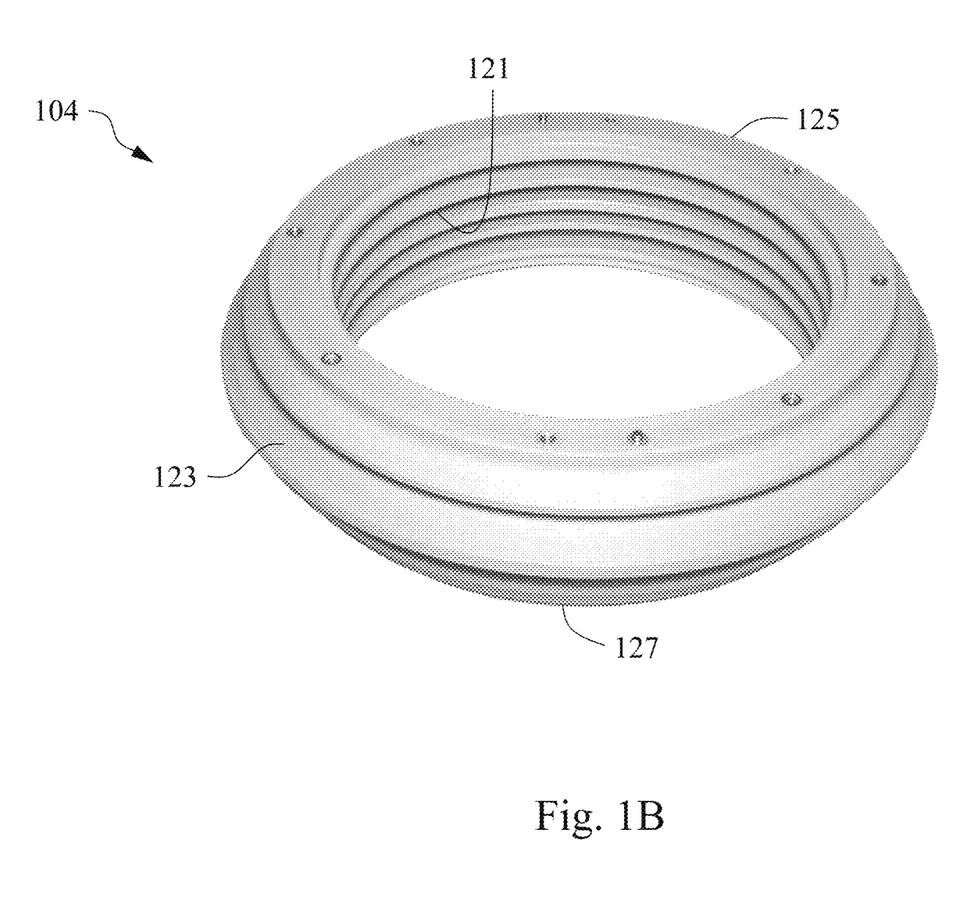
FIG. 1B is an isometric view of a bushing, according to some embodiments.

Bushing 104 can be disposed between ion source 102 and one of the conductor components to enhance electrical insulation between them. As illustrated in FIGS. 1A and 1B, bushing 104 can be a tubular body having an inner surface 121, an outer surface 123, a first end 125 and a second end 127. Inner surface 121 can enclose a portion of ion source 102 and be in a vacuum environment, while outer surface 123 can be exposed to an atmospheric conditions or external environment. First end 125 or second end 127 of bushing 104 can be secured or coupled to ion source 102 or one of the conductor components of source head device 107. To ensure a reliable electrical insulation between ion source 102 and the one of the conductor components, bushing 104 is made of materials with high resistivity, such as nylon, rubber, plastic, synthetic, epoxy resin, polymer, Teflon, or any other suitable materials. In some embodiments, bushing 104 can have an electrical resistance greater than about one Giga ohms between first end 125 and second end 127.

Atomic mass unit 108 can be disposed between source head device 107 and beamline area 103. Atomic mass unit 108 can be configured to block a first portion of ion species and allow a second portion of ion species in ion beam 110 to pass to beamline area 103. Atomic mass unit 108 can include a pre-position orifice and a magnet coil (not shown in FIG. 1A) to generate a magnetic field, where the magnetic field can exert a specific electromagnetic force for a respective ion specie to flow through a corresponding circular path. Since a radius of the corresponding circular path can be determined by a mass of the respective ion specie, ion species having substantially the same kinetic energies but different masses can have different corresponding circular paths. Therefore, a pre-position orifice can be disposed within the circular paths to selectively block the first portion of ion species and allow the second portion of ion species to pass to beamline area 103.

Beamline area 103 can be disposed downstream of atomic mass unit 108 and can be configured to accelerate, decelerate, deflect, scan, and shape the filtered ion beam provided by atomic mass unit 108. Beamline area 103 can include electrodes to accelerate or decelerate the filtered ion beams to a different energy. Beamline area 103 can further include lens (not shown in FIG. 1A) arranged to control dimensions of the filtered ion beam in orthogonal directions to adjust a cross-section of the filtered ion beam. Beamline area 103 can also include a scanning device (not shown in FIG. 1A) to exert electric fields or magnetic fields to allow the filtered ion beam to be scanned two-dimensionally on the targeted semiconductor wafer. As a result, the filtered ion beam passing through beamline area 103 can be applied to irradiate on the target semiconductor wafer at process chamber 105.

In some embodiments, beamline area 103 can be a free space as a ballistic drift region for the filtered ion beams. In some embodiments, beamline area 103 can further include a bending magnet (not shown in FIG. 1A) to filter neutral particles in the filtered ion beam.

Process chamber 105 can include a holder (not shown in FIG. 1A) to hold the targeted semiconductor wafer. The holder can be configured to move the semiconductor wafer two dimensionally relative to the ion beam provided by beamline area 103. The holder can also be configured to allow a single semiconductor wafer to be irradiated by the ion beam serially at a time, or multiple semiconductor wafers simultaneously at a time by repeating a mechanical passage of the multiple semiconductor wafers through the irradiation of the ion beam.

In some embodiments, IMP 100 can further include an image sensor (not shown in FIGS. 1A and 1B) configured to monitor inner surface 121 and/or outer surface 123 of bushing 104. For example, as bushing 104 is gradually coated with IMP by-products, inner surface 121 can start to exhibit a gradation of darken color, such as dark blue or dark grey. Such gradation can be recorded by the image sensor to gauge the electrical insulating property of bushing 104.

In some embodiments, IMP 100 can further include a computer system (not shown in FIG. 1A) to analyze a data provided by the electrical measurement device or the image sensor. For example, the computer system can be configured to compare the data with other bushing images and/or electrical leakage currents (e.g., historical bushing images and/or electrical leakage currents) associated with various stages of IMP by-products coating.

Figure 2:
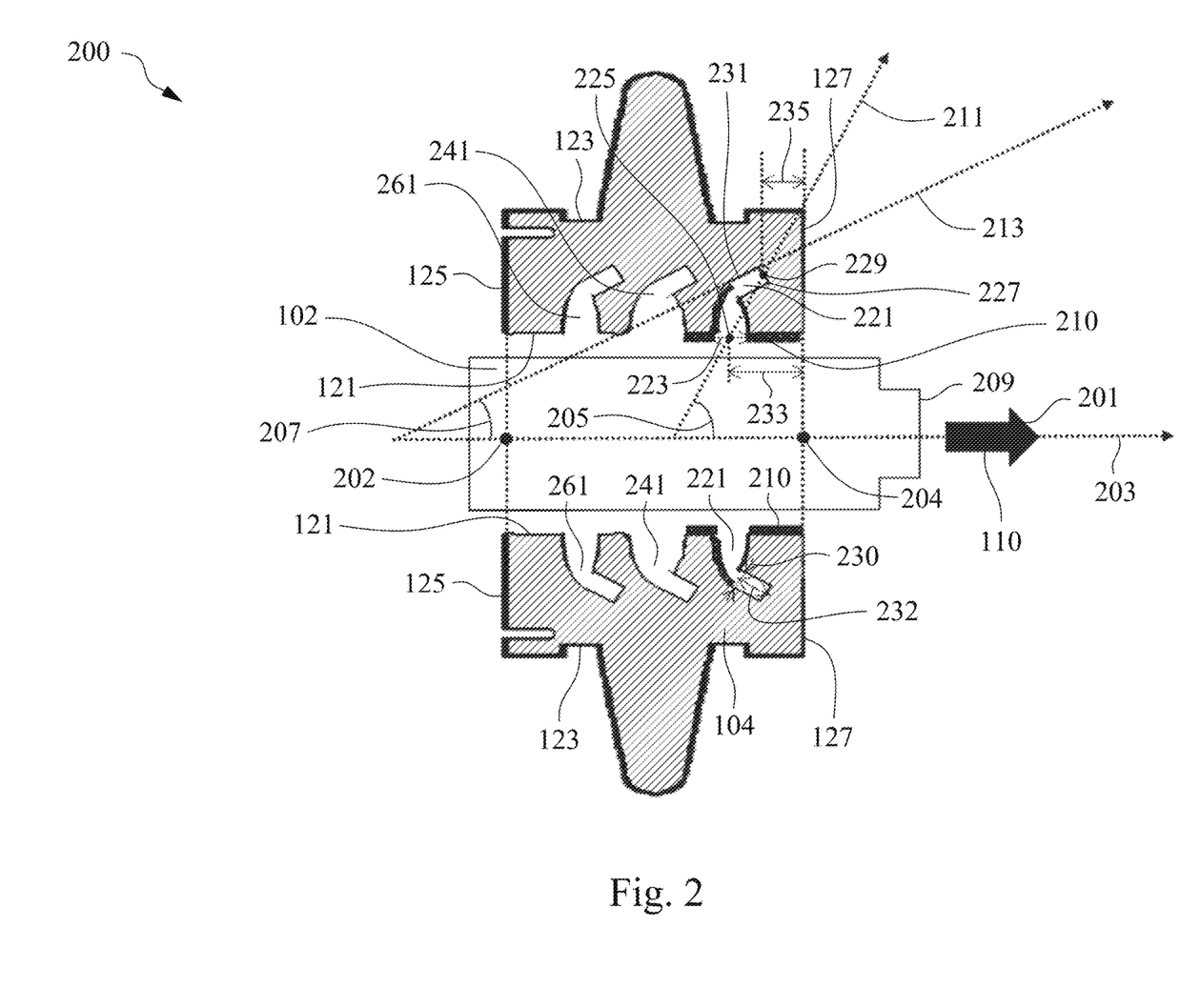
FIG. 2 is a cross-sectional view of a source head device, according to some embodiments.

FIG. 2 is a cross sectional view of source head device 200, according to some embodiments. The discussion of source head device 107 is applied to source head device 200 unless mentioned otherwise. As shown in FIG. 2, source head device 200 can include ion source 102 and bushing 104, where a portion of ion source 102 can be surrounded by a portion of inner surface 121 of bushing 104. Source head device 200 can further include an outlet 209, where ion beam 110 can be extracted through outlet 209 of source head device 200 in a direction 201. A directional longitudinal axis 203 of the tubular body of bushing 104, defined as an axis passing from a midpoint 202 of first end 125 to another midpoint 204 of second end 127 of bushing 104, can be substantially parallel to direction 201. In some embodiments, outlet 209 is disposed closer to second end 127 than first end 125 of bushing 104, and therefore a direction of longitudinal axis 203 of bushing 104 is substantially the same as direction 201.

One or more angled trenches, such as trenches 221, 241, and 261, can be disposed within inner surface 121 of bushing 104. Trench 221 has an opening 223 (e.g., a trench top 223), a trench bottom 227 (an innermost surface), and sidewalls 231 adjacent to trench bottom 227. Trench 221 can have a width 230 and a depth 232. Trench 221 can be arranged as an angled trench extending towards first end 125 or second end 127 of bushing 104, such that trench bottom 227 is closer to first end 125 or second end 127 of bushing 104, respectively. For example, trench bottom 227 can be arranged to extend towards second end 127 of bushing 104 (e.g., trench 221 is configured as an angled trench extending towards second end 127), such that a first separation 235, between second end 127 and a midpoint 229 of trench bottom 227, is smaller than a second separation 233 between second end 127 and a midpoint 225 of opening 223. In some embodiments, trench bottom 227 can be arranged to extend towards first end 125 of bushing 104 (e.g., trench 221 is configured as an angled trench extending towards first end 125) such that first separation 235 is larger than second separation 233.

In some embodiments, trench 221 can be configured as an angled trench associated with a first tilted angle 205, where first tilted angle 205 is an angle between longitudinal axis 203 and direction 211, defined as a direction from midpoint 225 of opening 223 to midpoint 229 of trench bottom 227. In the case that trench 221 is extended towards second end 127 of bushing 104, first tilted angle 205 can be an acute angle between about 30 degrees and about 90 degrees. In the case that trench 221 is extended towards first end 125, first tilted angle 205 can be an obtuse angle between about 90 degrees and about 150 degrees.

In some embodiments, first tilted angle 205 can be an acute angle between about 45 degrees and about 90 degrees. In some embodiments, first tilted angle 205 can be an acute angle between about 60 degrees and about 90 degrees. In some embodiments, first tilted angle 205 can be an acute angle equal to or less than about 75 degrees. In some embodiments, first tilted angle 205 can be an acute angle equal to or less than about 60 degrees. In some embodiments, first tilted angle 205 can be an obtuse angle between about 90 degrees and about 135 degrees. In some embodiments, first tilted angle 205 can be an obtuse angle between about 90 degrees and about 120 degrees. In some embodiments, first tilted angle 205 can be an obtuse angle equal to or larger than about 120 degrees. In some embodiments, first tilted angle 205 can be an obtuse angle equal to or larger than about 105 degrees.

In some embodiments, trench 221 can be configured as an angled trench associated with a second tilted angle 207, where second tilted angle 207 is an angle between longitudinal axis 203 and direction 213, defined as a direction parallel to a surface of sidewalls 231 adjacent to trench bottom 227. In the case that trench 221 is extended towards second end 127 of bushing 104, second tilted angle 207 can be an acute angle between about 30 degrees and about 90 degrees. In the case that trench 221 is extended towards first end 125, second tilted angle 207 can be an obtuse angle between about 90 degrees and about 150 degrees.

In some embodiments, second tilted angle 207 can be an acute angle between about 45 degrees and about 90 degrees. In some embodiments, second tilted angle 207 can be an acute angle between about 60 degrees and about 90 degrees. In some embodiments, second tilted angle 207 can be an acute angle equal to or less than about 75 degrees. In some embodiments, second tilted angle 207 can be an acute angle equal to or less than about 60 degrees. In some embodiments, second tilted angle 207 can be an obtuse angle between about 90 degrees and about 135 degrees. In some embodiments, second tilted angle 207 can be an obtuse angle between about 90 degrees and about 120 degrees. In some embodiments, second tilted angle 207 can be an obtuse angle equal to or larger than about 120 degrees. In some embodiments, second tilted angle 207 can be an obtuse angle equal to or larger than about 105 degrees.

In some embodiments, trench 221 can be configured as an angled trench extending towards second end 127 of bushing 104, where outlet 209 is disposed closer to second end 127 than first end 125, such that trench 221 is configured as a trench tilted towards ion beam moving direction 201.

In some embodiments, trench 221 can be configured as an angled trench extending towards first end 125 of bushing 104, where outlet 209 is disposed closer to second end 127 than first end 125, such that trench 221 is configured as a trench tilted against ion beam moving direction 201.

In some embodiments, trench 221 can have width 230 equal to or greater than about 25 mm. In some embodiments, trench 221 can have width 230 between about 20 mm and about 35 mm, between about 22 mm and about 30 mm, or between about 24 mm and about 28 mm.

In some embodiments, trench 221 can have depth 232 equal to or greater than about 25 mm, between about 20 mm and about 35 mm, between about 22 mm and about 30 mm, or between about 24 mm and about 28 mm.

The above discussion of trench 221 can be applied to each of the one or more angled trenches such as trench 241 and 261. In some embodiments, a configuration of trench 221 can be the same or different from a configuration of another trench of the one or more angled trenches, such as trenches 241 and 261, disposed at inner surface 121 of bushing 104. For example, width 230 of trench 221 can be different from a respective width of trench 241. For another example, first tilted angle 205 of trench 221 can be different from a respective tilted angle of trench 241. In some embodiments, another set of trenches, adjacent to or interleaved with the one or more angled trenches (e.g., trenches 221, 241, or 261), can be disposed at inner surface 121 of bushing 104.

As discussed above, the formation of ion beam 110 can introduce IMP by-products 210. IMP by-products 210 can diffuse or drift towards inner surface 121 of bushing 104 and tend to form a conduction path between first end 125 and second end 127 of bushing 104. This can cause an aging of the bushing 104 which can compromise the electrical insulation provided by bushing 104. As shown in FIG. 2, the formation of IMP by-products 210 can be initiated at outlet 209 of source head device 200. Therefore, IMP by-products 210 start to adhere to a portion of inner surface 121 near second end 127, closer to outlet 209, and form the conduction path towards first end 125. In other words, the adhesion of IMP by-products 210 can propagate along a direction opposite to direction 201.

Bushing 104, configured with one or more angled trenches (e.g., trench 221) extending towards first end 125 or second end 127, can inhibit formation of the conduction path at inner surface 121. This is because trench bottom 227 is arranged to extend towards first end 125 or second end 127. With trench bottom 227 disposed deeply inside the tubular body of bushing 104, the adhesion of IMP by-products 210 on trench bottom 227 and sidewalls 231 adjacent to trench bottom 227 can be significantly suppressed. As a result, the one or more angled trenches inhibit forming the continuous conduction path within inner surface 121. Therefore, bushing 104 can provide more robust and reliable capability of electrical insulation. In some embodiments, bushing 104 configured with one or more angled trenches extending towards second end 127, proximate to outlet 209, can further suppress the adhesion of IMP by-products 210.

In some embodiments, the electrical measurement device (not shown in FIG. 2) of IMP 100 can be further configured to monitor a resistance change of bushing 104 caused by the adhesion of IMP by-products 210 at inner surface 121 of bushing 104.

Figure 3:
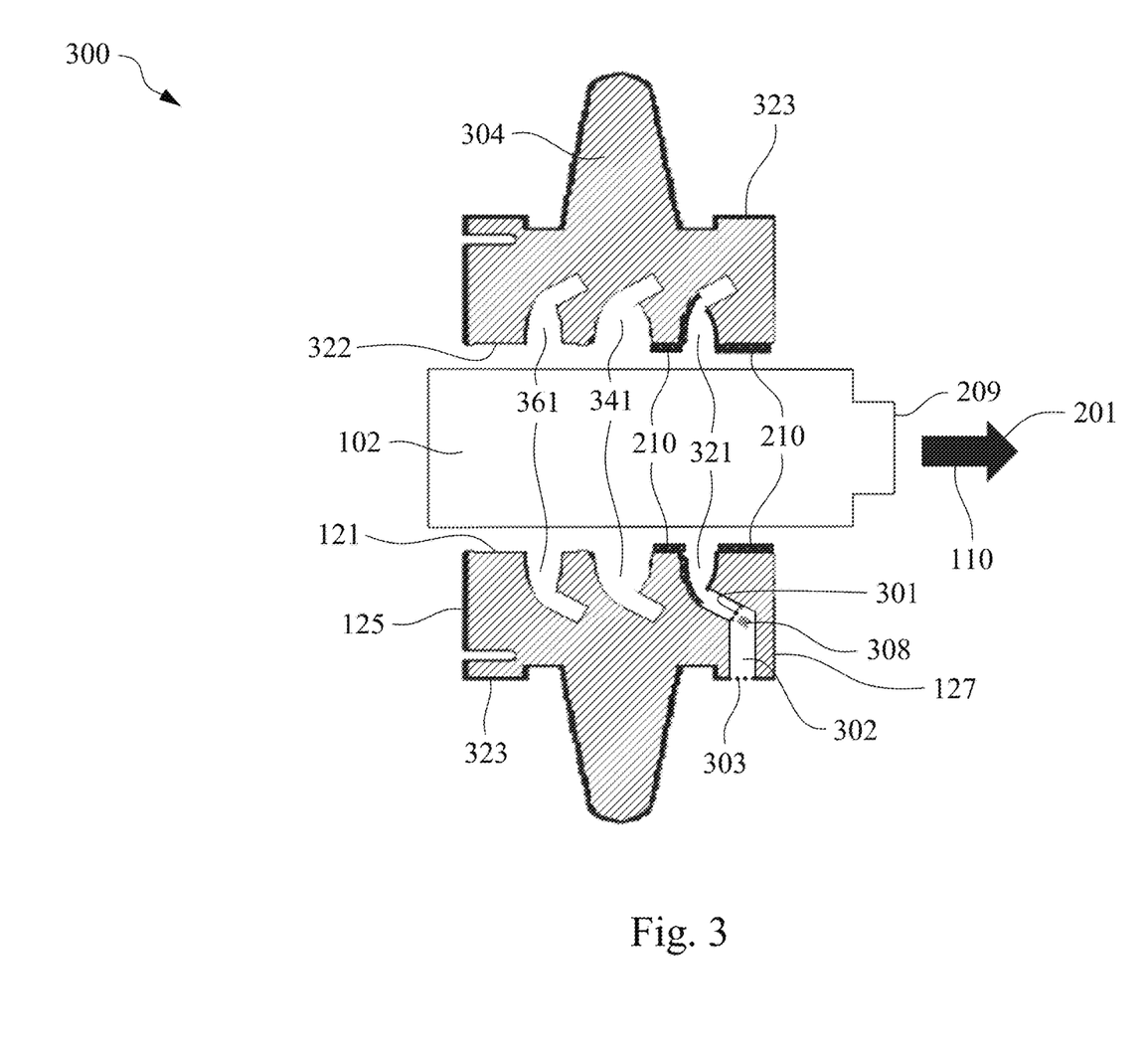
FIG. 3 is a cross-sectional view of a source head device, according to some embodiments.

FIG. 3 is a cross sectional view of source head device 300, according to some embodiments. Source head device 300 can include ion source 102 and a bushing 304. The discussion of source head device 200 and bushing 104 are applied to source head device 300 and bushing 304, respectively, unless mentioned otherwise. As shown in FIG. 3, bushing 304 can include trenches, such as trench 321, 341, and 361, disposed at its inner surface 322. A cavity 302 can be disposed between one of the trenches such as a trench 321, similar to trench 221 of bushing 104, and outer surface 323 of bushing 304, where a first end 301 and a second end 303 of cavity 302 can be exposed to the one of the trenches (e.g. trench 321) and outer surface 323, respectively. In some embodiments, cavity 302 can be disposed between first end 125 and the one of the trenches. In some embodiments, cavity 302 can be disposed between second end 127 and the one of the trenches. A transparent viewport flange (not shown in FIG. 3) can be disposed at first end 301 or second end 303 of cavity 302 to provide a vacuum sealing between inner surface 322 and outer surface 323 of bushing 304.

IMP by-products 210 can gradually alter a visual signature of inner surface 322. For example, inner surface 322 coated with IMP by-products 210 can gradually exhibit a darken hue or a gradation of colors from grey to blue. As a result, the visual signature of inner surface 322 can be an important indication about an aging status of bushing 304. Therefore, as shown in FIG. 3, source head device 300 can further include an image sensor 308 configured to record the visual signature of inner surface 322 of bushing 304. In some embodiments, image sensor 308 can be disposed within cavity 302, where the transparent viewport flange can be disposed at first end 301 of cavity 302. In some embodiments, image sensor 308 can be disposed outside second end 303 of cavity 302, where the transparent viewport flange can be disposed at second end 303 of cavity 302.

Image sensor 308 can be configured to generate images having any suitable resolution (e.g., 640 pixel×480 pixels), greyscale (e.g., 256 combinations of shades of gray), chrominance, or frame rate (e.g., 30 pictures per second). Image data can be sent to the computer system of IMP 100 (not shown in FIG. 3) for further analysis. The computer system can perform a computing procedure, including one or more mathematical operations, to analyze the images. In some embodiments, the computing procedure can further include a pattern recognition procedure to analyze imaging information, such as contrasts and brightness, in the images provided by image sensor 308. In some embodiments, the computing procedure can also include a machine learning procedure to predict an aging characteristics of bushing 304. In some embodiments, the machine learning procedure can include a neural network algorithm. In some embodiments, the computing procedure can including a big data mining procedure to classify and cluster the images recorded by image sensor 308.

In some embodiments, electrical data associated source head device 300 can be recorded by the electrical measurement device of IMP 100. The electrical data can include any suitable electrical information such as resistance and time-varying amplitude, recurrence of spiking, and/or frequency response of voltage or electrical current. The electrical data recorded by the electrical measurement device can be sent to the computer system for further analysis. The computer system can perform the computing procedure, similar to the discussion above, to analyze the electrical current data.

Based on the electrical data or the image data analysis, the computer system can adjust one or more parameters/conditions of IMP 100. The parameters/conditions can include instructing a process controller (not shown in FIGS. 1-3) associated with IMP 100 to adjust recipes of ion implantation on the semiconductor wafer. The parameters/conditions can also include interlocking an operation of IMP 100. For example, the interlocking can include triggering a preventive maintenance to replace or clean bushing 104, or adjusting a manufacturing schedule of semiconductor device using IMP 100.

Figure 4:
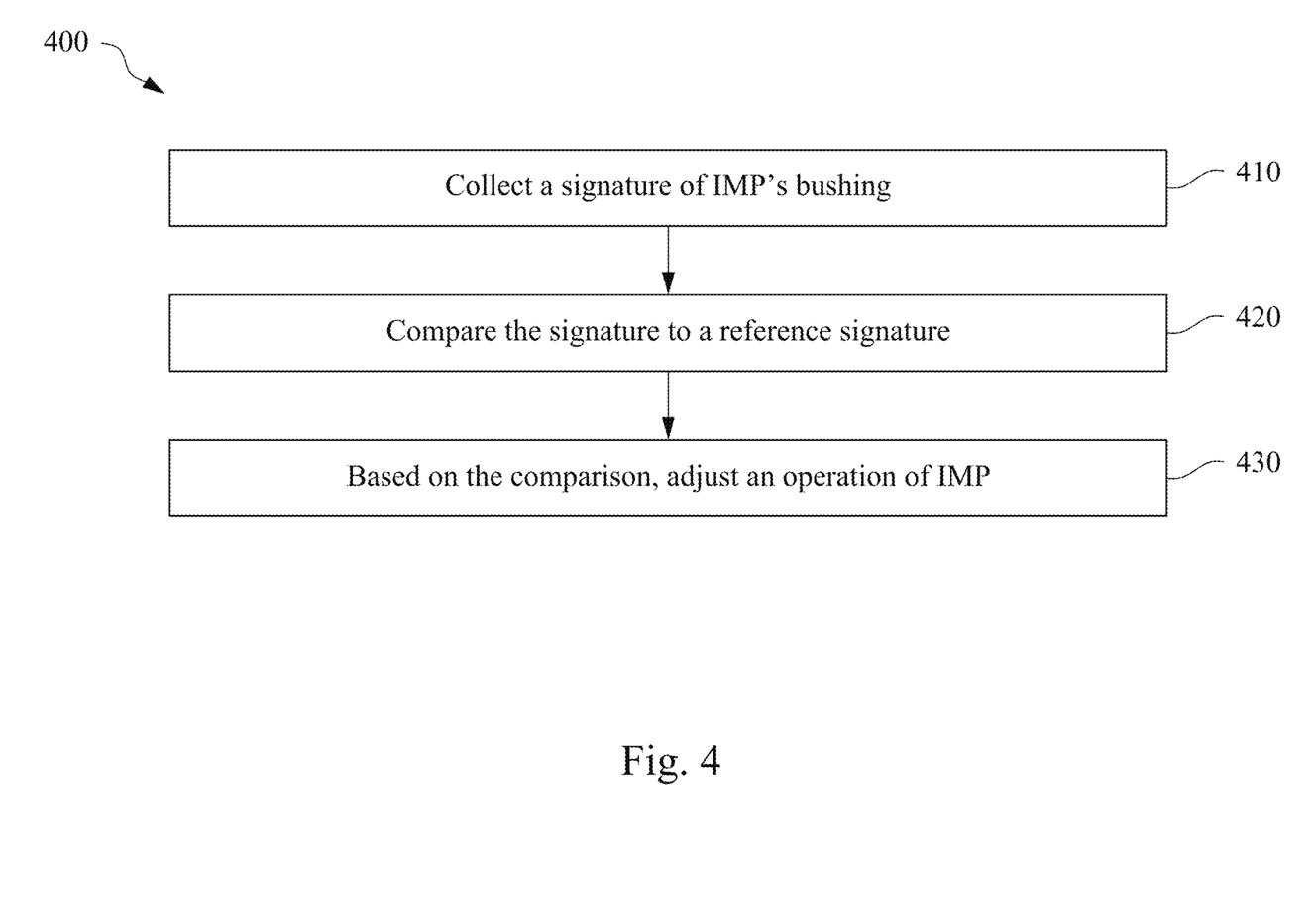
FIG. 4 is a high-level block diagram of an example computer system, according to some embodiments.

FIG. 4 is an exemplary method 400 for operating an IMP, where IMP can include a bushing, an image sensor, and an electrical meter to monitor the bushing, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 4. In some implementations, one or more other operations may be performed in addition to or in place of the presently described operations. For illustrative purposes, method 400 is described with reference to the embodiments of FIGS. 1-3. However, method 400 is not limited to these embodiments.

Exemplary method 400 begins with operation 410, where a signature of the IMP's bushing is collected. The signature of IMP's bushing can include a visual signature of the bushing's inner surfaces. For example, the visual signature of the IMP's bushing can include the bushing's inner surfaces' gradation of colors associated with a adhesion status of IMP by-products. The visual signature can be collected by the IMP's image sensor. The IMP's image sensor can transmit the collected visual signature to IMP's computer system with suitable resolution, greyscale, chrominance and frame rate. In some embodiments, the visual signature can be collected by IMP's image sensor while IMP is conducting an ion implantation process. In some embodiments, the collection of the visual signature is described with respect to FIG. 3.

In some embodiments, the IMP's image sensor can be disposed between the inner surfaces and outer surfaces of IMP's bushing.

In some embodiments, one or more trenches are disposed in the bushing's inner surfaces, where a cavity is further disposed between the outer surfaces of the IMP's bushing and the one of the trenches. The image sensor can be disposed inside or adjacent to the cavity to monitor the inner surface of the tubular body of the IMP's bushing.

The signature of the IMP's bushing can further include an electrical signature associated with the IMP's source head device. For example, the electrical signature can include an amplitude of leakage current, occurrence of electrical current spikes, or operating voltage associated with IMP's source head device. The electrical signature can further include an electrical resistance of the IMP's bushing. The electrical signature can be collected by the IMP's electrical measurement device. The electrical measurement device can transmit the electrical signature to the IMP's computer system. In some embodiments, the electrical signature can be collected by the IMP's electrical measurement device while the IMP conducts an ion implantation process. In some embodiments, the electrical measurement device can be an electrical current meter. In some embodiments, the collection of electrical signature is described with respect to FIGS. 1A and 1B.

The ion implantation process can result in the formation of IMP by-products, in which the IMP by-products can diffuse or drift towards the inner surface of the bushing.

In operation 420, the IMP signature is compared to a reference signature. The reference signature can be a pre-determined signature of the IMP's bushing. The pre-determined signature can be a historical signature of a previous IMP's bushing associated with an electrical resistance larger than one Giga Ohms. For example, the pre-determined visual signature can be a new IMP's bushing's greyscale color. In another example, the pre-determined electrical signature can be an upper limit of leakage current of the IMP's source head device. The comparison can include pixel subtraction between the visual signature and the reference visual signature. The comparison can further include verifying a difference between the electrical signature and the reference electrical signature.

In some embodiments, the comparison can be performed by the IMP's computer system as described in FIG. 1A. The IMP's computer system can be configured to apply a computing procedure to perform the comparison. The computing procedure can include a big data mining process that generates the pre-determined signature by averaging historical signatures of multiple previous bushings used by IMP. The computing procedure can also include a machine learning process, where training data for the machine learning process can include signatures of previous bushings associated with respective electrical insulating characteristics. Such training data can be used to train the machine learning process by following a respective training procedure associated with the machine learning process. The well-trained machine learning process (e.g. configured with optimized parameters) can compare the signature of the current bushing to that of previous bushings. In some embodiments, the machine learning process can include a supervised machine learning process, such as linear regression, logistic regression, decision tree, random forest, support vector machine, artificial neural network, convolution neural network, recurrent neural network, or deep learning, where the supervised machine learning process can be trained or optimized by introducing the training data through one or more training procedures (e.g., gradient decent algorithm) associated with the supervised machine learning process.

In operation 430, the computer system adjusts an operation of IMP based on the comparison. The adjustment can include updating one or more recipes of the ion implantation process. For example, the adjustment can be reducing an upper limit of an applied voltage for the ion implantation process. The adjustment can further include interlocking the operation of IMP, such as triggering a preventive maintenance alert to replace or clean the bushing, or adjusting a manufacturing schedule of semiconductor device using IMP. For example, the adjustment can notify a supply-chain management to start preparing an inventory of new bushing.

Figure 5:
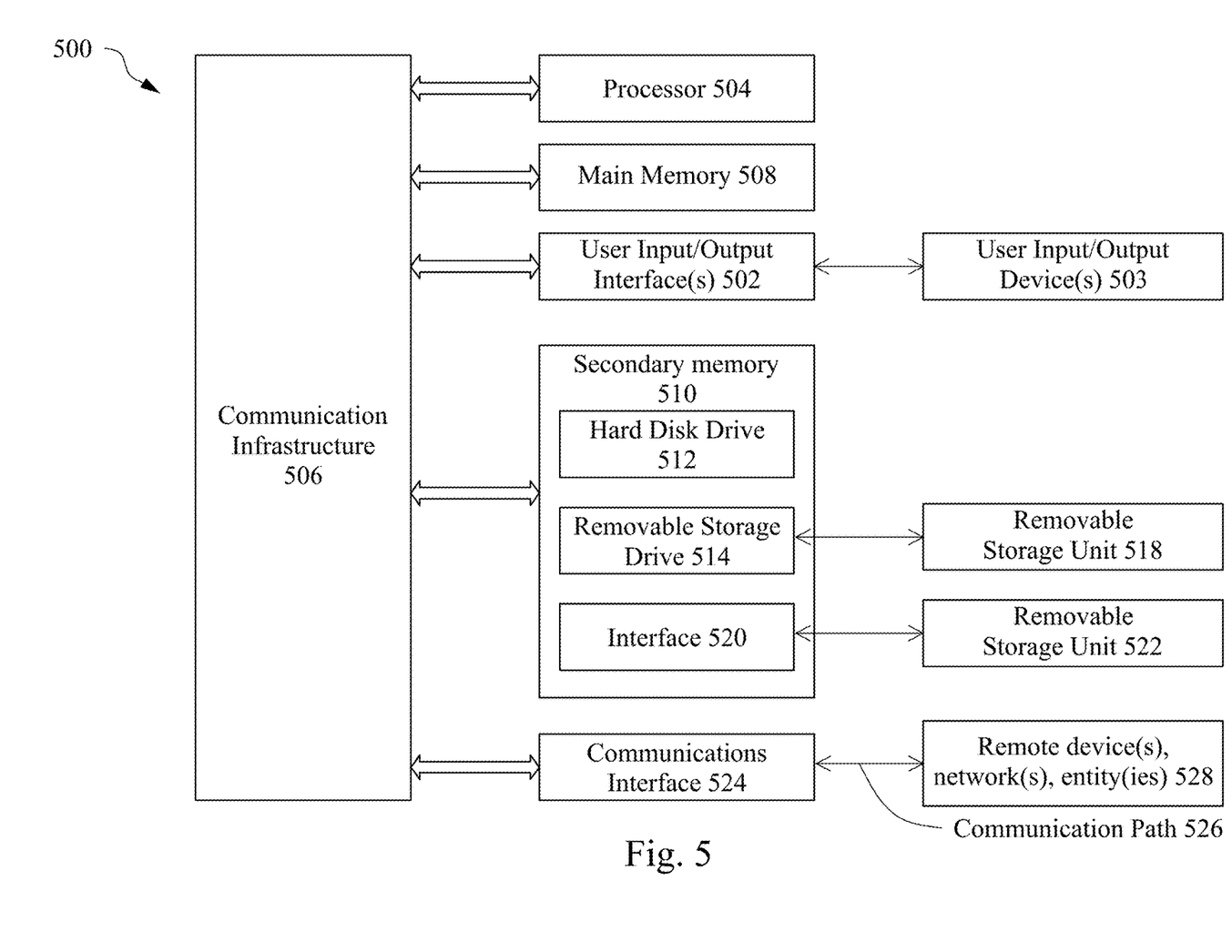
FIG. 5 is a flow chart of a method operating an ion implantation system, according to some embodiments.

Various aspects of the exemplary embodiments may be implemented in software, firmware, hardware, or a combination thereof. FIG. 5 is an illustration of an example computer system 500 in which embodiments of the present disclosure, or portions thereof, can be implemented as computer-readable code. Various embodiments of the present disclosure are described in terms of this example computer system 500. For example, the computer system or the process controller of IMP 100 can be incorporated as an embodiment of computer system 500.

Computer system 500 includes one or more processors, such as processor 504. Processor 504 is connected to a communication infrastructure 506 (e.g., a bus or network).

Computer system 500 also includes a main memory 508, such as random access memory (RAM), and may also include a secondary memory 510. Secondary memory 510 can include, for example, a hard disk drive 512, a removable storage drive 514, and/or a memory stick. Removable storage drive 514 can include a floppy disk drive, a magnetic tape drive, an optical disk drive, a flash memory, or the like. Removable storage drive 514 reads from and/or writes to a removable storage unit 518 in a well-known manner. Removable storage unit 518 can include a floppy disk, magnetic tape, optical disk, flash drive, etc., which is read by and written to by removable storage drive 514. Removable storage unit 518 includes a computer-readable storage medium having stored therein computer software and/or data. Computer system 500 includes a display interface 502 (which can include input and output devices 503, such as keyboards, mice, etc.) that forwards graphics, text, and other data from communication infrastructure 506 (or from a frame buffer not shown).

In alternative implementations, secondary memory 510 can include other similar devices for allowing computer programs or other instructions to be loaded into computer system 500. Such devices can include, for example, a removable storage unit 522 and an interface 520. Examples of such devices include a program cartridge and cartridge interface (such as those found in video game devices), a removable memory chip (e.g., EPROM or PROM) and associated socket, and other removable storage units 522 and interfaces 520 which allow software and data to be transferred from the removable storage unit 522 to computer system 500.

Computer system 500 can also include a communications interface 524. Communications interface 524 allows software and data to be transferred between computer system 500 and external devices. Communications interface 524 can include a modem, a network interface (such as an Ethernet card), a communications port, or the like. Software and data transferred via communications interface 524 are in the form of signals which may be electronic, electromagnetic, optical, or other signals capable of being received by communications interface 524. These signals are provided to communications interface 524 via a communications path 526. Communications path 526 carries signals and can be implemented using wire or cable, fiber optics, a phone line, a cellular phone link, a RF link, or other communications channels.

In this document, the terms "computer program storage medium" and "computer-readable storage medium" are used to generally refer to non-transitory media such as removable storage unit 518, removable storage unit 522, and a hard disk installed in hard disk drive 512. Computer program storage medium and computer-readable storage medium can also refer to memories, such as main memory 508 and secondary memory 510, which can be semiconductor memories (e.g., DRAMs, etc.). Embodiments of the present disclosure can employ any computer-readable medium, known now or in the future. Examples of computer-readable storage media include, but are not limited to, non-transitory primary storage devices (e.g., any type of random access memory), and non-transitory secondary storage devices (e.g., hard drives, floppy disks, CD ROMs, ZIP disks, tapes, magnetic storage devices, optical storage devices, MEMS, nanotechnological storage devices, etc.).

These computer program products provide software to computer system 500. Embodiments of the present disclosure are also directed to computer program products including software stored on any computer-readable storage medium. Such software, when executed in one or more data processing devices, causes a data processing device(s) to operate as described herein.

Computer programs (also referred to herein as "computer control logic") are stored in main memory 508 and/or secondary memory 510. Computer programs may also be received via communications interface 524. Such computer programs, when executed, enable computer system 500 to implement various embodiments of the present disclosure. In particular, the computer programs, when executed, enable processor 504 to implement processes of embodiments of the present disclosure, such as the operations in the methods illustrated by FIG. 4 in system 500. Where embodiments of the present disclosure are implemented using software, the software can be stored in a computer program product and loaded into computer system 500 using removable storage drive 514, interface 520, hard drive 512, or communications interface 524.

The functions/operations in the preceding embodiments can be implemented in a wide variety of configurations and architectures. Therefore, some or all of the operations in the preceding embodiments—e.g., the functions of system 100 described in FIG. 1A and the method/process described in FIG. 4—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 500, main memory 508, secondary memory 510 and removable storage units 518 and 522, as well as tangible articles of manufacture embodying any combination of the foregoing. Such control logic, when executed by one or more data processing devices (such as computer system 500), causes such data processing devices to operate as described herein. For example, the hardware/equipment can be connected to or be part of element 528 (remote device(s), network(s), entity(ies) 528) of computer system 500.

The present disclosure provides an IMP apparatus and a method for an IMP process that uses a bushing, where the bushing can include a tubular body with tilted trenches disposed within the tubular body's inner surface. In some embodiments, the tilted trenches can be configured to tilt toward an end of the tubular body to inhibit a coating of IMP by-products on the bushing's inner surfaces. The IMP apparatus can further include an image sensor and/or an electrical measurement device to monitor the bushing's aging status. Such IMP apparatus and the bushing can improve the reliability of the IMP apparatus and therefore reduce manufacturing and maintenance costs.

In some embodiments, an ion implantation system can include a chamber, an ion source configured to generate an ion beam, and a bushing coupling the ion source and the chamber. The bushing can include a tubular body and multiple angled trenches. The tubular body can include an inner surface, a first end, and a second end. The multiple angled trenches can be disposed within the inner surface of the tubular body. Each of the multiple angled trenches can extend towards the second end of the tubular body.

In some embodiments, a bushing for electrical isolation can include a tubular body and multiple angled trenches. The tubular body can include an outer surface, an inner surface, a first end, and a second end. The multiple angled trenches can be disposed within the inner surface of the tubular body. Each of the multiple angled trenches can extend towards the second end of the tubular body. A separation between the second end of the tubular body and a midpoint of a top of each of the multiple angled trenches is greater than that between the second end of the tubular body and a bottom of each of the multiple angled trenches.

In some embodiments, an ion implantation system can include (i) a source head device configured to extract an ion beam and (ii) an image sensor. The source head device can include a first conductor component, a second conductor component, and a bushing coupling the first and second conductor components. The bushing can include a tubular body including an inner surface and an outer surface, one or more trenches disposed within the inner surface of the tubular body, and a cavity disposed between the outer surface of the tubular body and one of the one or more trenches, where a first end of the cavity is opened to the one of the one or more trenches and a second end of the cavity is opened to a portion of the outer surface of the tubular body. The image sensor can be configured to record a visual signature of the inner surface of the tubular body.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. An ion implantation system, comprising:
 a chamber;
 an ion source configured to generate an ion beam; and
 a bushing coupling the ion source and the chamber, wherein the hushing comprises an inner surface and an angled trench protruding into the inner surface, wherein the angled trench is tilted with respect to the inner surface.

2. The ion implantation system of claim 1, wherein a bottom of the angled trench is proximate to a first end of the bushing, and wherein an opening of the angled trench is proximate to a second end of the bushing.

3. The ion implantation system of claim 2, wherein an outlet of the ion source is closer to the first end of the bushing than to the second end of the bushing.

4. The ion implantation system of claim 1, wherein the bushing extends along a first direction, wherein the angled trench extends along a second direction, and wherein an acute angle between the first direction and the second direction is less than or equal to about 75 degrees.

5. The ion implantation system of claim 1, wherein an acute angle between the inner surface of the bushing and a sidewall of the angled trench is less than or equal to about 75 degrees.

6. The ion implantation system of claim 1, wherein the bushing extends along a direction, wherein the bushing further comprises an other angled trench adjacent to the angled trench along the direction, and wherein the other angled trench protrudes into the inner surface and tilts with respect to the inner surface.

7. The ion implantation system of claim 6, wherein an acute angle between the inner surface and a sidewall of the angled trench is different from an other acute angle between the inner surface and an other sidewall of the other angled trench.

8. A bushing for electrical isolation, comprising:
 a tubular body comprising an inner surface and an end; and
 a trench protruding into the inner surface of the tubular body and slanting towards the end of the tubular body.

9. The bushing of claim 8, wherein the tubular body comprises an electrical insulating material.

10. The bushing of claim 8, wherein a resistance between the end of the tubular body and an other end of the tubular body is greater than about 1 Giga ohm.

11. The bushing of claim 8, wherein a width of the trench is equal to or greater than about 25 mm.

12. The bushing of claim 8, wherein a depth of the trench is equal to or greater than about 25 mm.

13. The bushing of claim 8, wherein a separation between the end of the tubular body and an opening of the trench is greater than an other separation between the end of the tubular body and a bottom of the trench.

14. The bushing of claim 8, wherein an acute angle between the inner surface of the tubular body and a sidewall of the trench is equal to or less than about 75 degrees.

15. An ion implantation system, comprising:
 a source head device configured to extract an ion beam, comprising:
  a conductor component;
  a bushing coupled to the conductor component, comprising:
   a tubular body comprising a sidewall; and
   a trench formed through the sidewall of the tubular body; and
 an image sensor disposed in the trench and configured to record a visual signature of the tubular body.

16. The ion implantation system of claim 15, wherein the trench slants towards an end of the tubular body.

17. The ion implantation system of claim 15, wherein an acute angle between the sidewall of the tubular body and an other sidewall of the trench is equal to or less than about 75 degrees.

18. The ion implantation system of claim 15, further comprising a viewport flange disposed at an end of the trench.

19. The ion implantation system of claim 15, further comprising an electrical measurement device to monitor an electrical property associated with the source head device.

20. The ion implantation system of claim 15, wherein the bushing further comprises an other trench adjacent to the trench, and wherein the other trench protrudes into the sidewall of the tubular body and slants towards an end of the tubular body.

* * * * *